US010528128B1

(12) United States Patent
Yoon et al.

(10) Patent No.: US 10,528,128 B1
(45) Date of Patent: Jan. 7, 2020

(54) HEAD-MOUNTED DISPLAY DEVICES WITH TRANSPARENT DISPLAY PANELS FOR EYE TRACKING

(71) Applicant: Facebook Technologies, LLC, Menlo Park, CA (US)

(72) Inventors: Youngshik Yoon, Cupertino, CA (US); Cheonhong Kim, Mountain View, CA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 15/843,725

(22) Filed: Dec. 15, 2017

(51) Int. Cl.
*G06F 3/01* (2006.01)
*G02B 27/01* (2006.01)
*G06T 11/60* (2006.01)
*G02B 5/20* (2006.01)
*H01L 27/32* (2006.01)

(52) U.S. Cl.
CPC .............. *G06F 3/013* (2013.01); *G02B 5/208* (2013.01); *G02B 27/0172* (2013.01); *G02B 27/0179* (2013.01); *G06T 11/60* (2013.01); *H01L 27/3293* (2013.01); *G02B 27/017* (2013.01); *G02B 2027/014* (2013.01); *G02B 2027/0138* (2013.01); *G02B 2027/0178* (2013.01); *G02B 2027/0187* (2013.01); *G06F 3/015* (2013.01)

(58) Field of Classification Search
CPC ........ G06F 3/013; G06F 3/015; G02B 27/017
See application file for complete search history.

(56) References Cited

U.S. PATENT DOCUMENTS

| 2008/0094720 | A1* | 4/2008 | Yamazaki | G02B 27/017 359/631 |
| 2016/0026253 | A1* | 1/2016 | Bradski | G02B 27/225 345/8 |
| 2016/0270656 | A1 | 9/2016 | Samec et al. | |
| 2017/0242220 | A1* | 8/2017 | Lee | G02B 13/06 |
| 2019/0012540 | A1* | 1/2019 | Trail | G06K 9/00604 |

OTHER PUBLICATIONS

Yoon, Office Action, U.S. Appl. No. 15/942,283, dated Jun. 10, 2019, 27 pgs.
Yoon, Final Office Action, U.S. Appl. No. 15/942,283, dated Sep. 30, 2019, 23 pgs.

* cited by examiner

*Primary Examiner* — Matthew Salvucci
(74) *Attorney, Agent, or Firm* — Morgan, Lewis & Bockius LLP

(57) ABSTRACT

A head-mounted display device includes a transparent display for projecting light toward an eye so that images rendered based on the augmented reality contents overlap with real images. The device also includes a mirror configured to reflect infrared light and transmit a portion of visible light corresponding to the real images, and an infrared light source configured to emit infrared light, which is reflected by the mirror toward the transparent display and transmitted through the transparent display toward the eye. The device further includes a sensor configured to detect infrared light reflected from the eye for determining a gaze direction of the eye. The infrared light reflected from the eye is transmitted through the transparent display and reflected by the mirror toward the sensor. In some embodiments, the device includes a lens for transmitting the projected light, the infrared light, and the visible light.

19 Claims, 13 Drawing Sheets

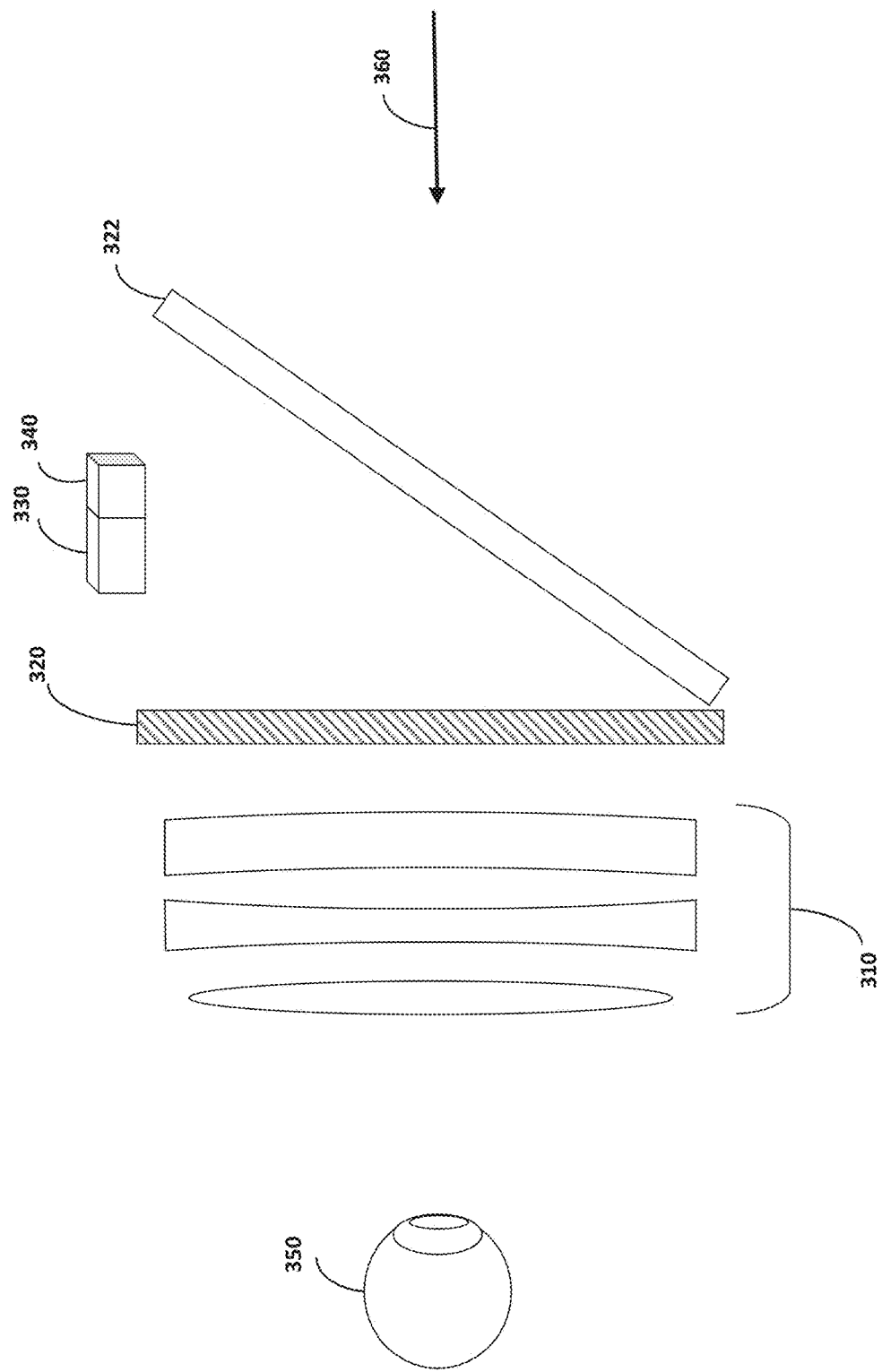

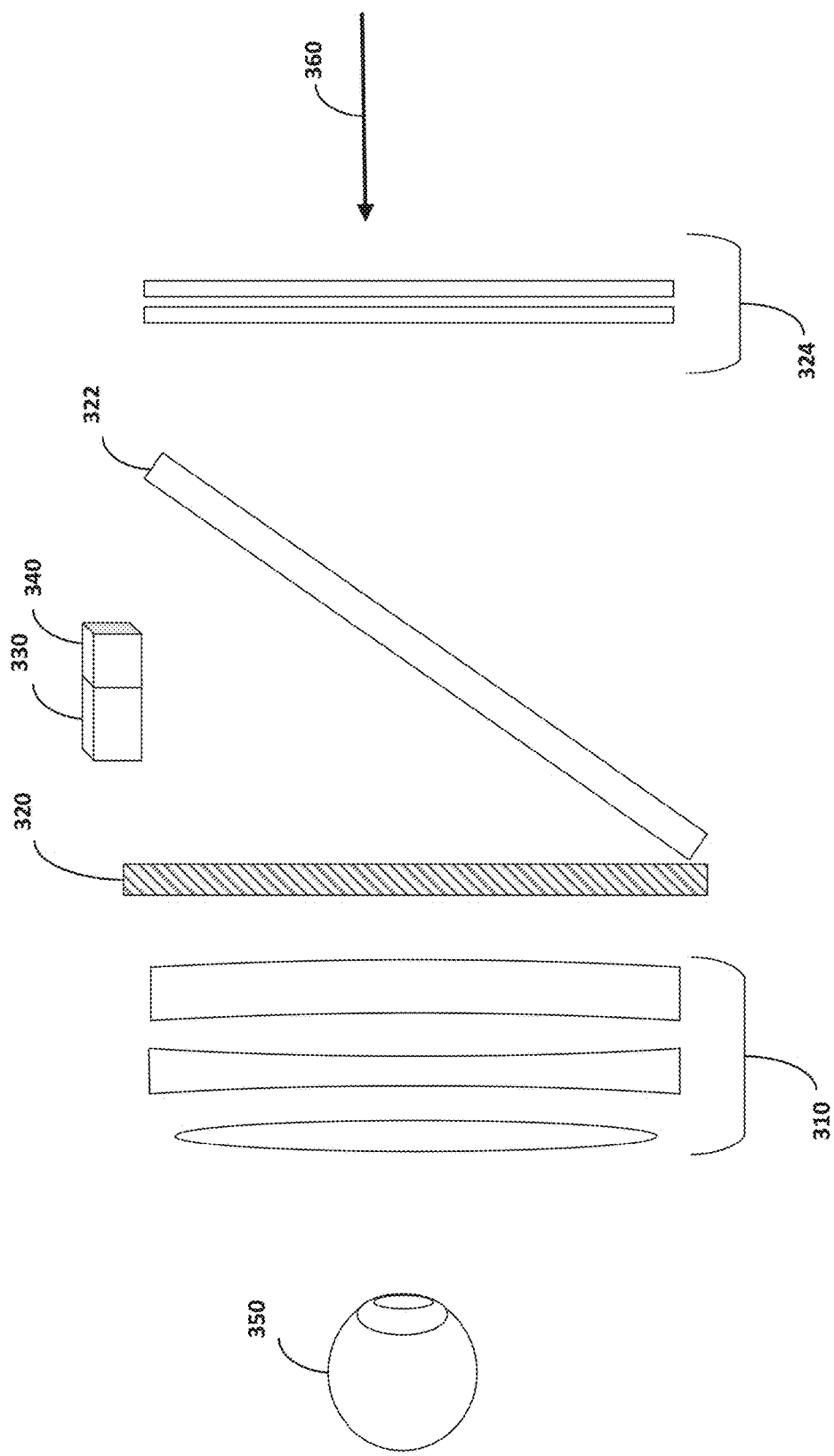

HEAD-MOUNTED DISPLAY DEVICES WITH TRANSPARENT DISPLAY PANELS FOR EYE TRACKING

TECHNICAL FIELD

This application relates to a head-mounted display device for providing augmented reality contents or virtual reality contents.

BACKGROUND

Head-mounted display devices (also called herein head-mounted displays) are gaining popularity as means for providing visual information to a user. Some of the head-mounted display devices are provided with eye tracking sensors for updating visual information based on the information from the eye tracking sensors.

However, in conventional head-mounted display devices, eye tracking sensors are located away from an optical axis of display devices due to the limited space available in conventional head-mounted display devices. In particular, even more restricted space is available for head-mounted display devices configured for augmented reality or mixed reality operations. Such configurations have limited the accuracy in determining gaze directions of eyes of a wearer due to off-axis illumination and sensing in eye tracking.

SUMMARY

Accordingly, there is a need for head-mounted displays with enhanced accuracy in eye tracking. In addition, such head-mounted displays need to be light and compact so as to improve the user satisfaction with such devices.

The above deficiencies and other problems associated with conventional head-mounted displays are reduced or eliminated by the disclosed display devices. Head-mounted display devices described in this application can be used for providing augmented reality contents, virtual reality contents or some combination thereof. In accordance with some embodiments, the head-mounted display includes one or more lenses, one or more transparent displays, a mirror, one or more infrared light sources and one or more sensors.

The one or more transparent displays are coupled with the one or more lenses for projecting light toward one or more eyes of the wearer through the one or more lenses, and provide images rendered based at least on the augmented reality contents for overlap with real images. In some embodiments, the one or more transparent displays include one or more organic light emitting diode displays.

The mirror is inclined at an angle from an optical axis of the one or more lenses to reflect infrared light and transmit at least a first portion of visible light corresponding to the real images. The visible light corresponding to the real images is provided from an outside of the device.

The one or more infrared light sources emit infrared light and the infrared light emitted by the one or more infrared light sources is reflected by the mirror toward the one or more transparent displays so that the reflected infrared light is transmitted through the one or more transparent displays and the one or more lenses toward the one or more eyes of the wearer.

The one or more sensors detect infrared light reflected from the one or more eyes of the wearer for determining a gaze direction of the one or more eyes of the wearer. The infrared light reflected from the one or more eyes of the wearer is transmitted through the one or more lenses and the one or more transparent displays, and reflected by the mirror toward the one or more sensors.

In some embodiments, the head-mounted display device includes one or more additional lenses. The one or more additional lenses transmit the visible light corresponding to the real images toward the one or more eyes of the wearer through the mirror and the one or more lenses. In addition, the one or more additional lenses offset a magnification of the real images caused by the one or more lenses located in front of the transparent displays.

In some embodiment, the head-mounted display device further includes one or more first processors. The one or more first processors determine the gaze direction of the one or more eyes of the wearer based on the infrared light that is reflected from the one or more eyes of the wearer and detected by the one or more sensors.

In some embodiments, the head mounted display device includes one or more second processors. The one or more second processors render the images based on information indicating the determined gaze direction of the one or more eyes of the wearer so that the real images and the rendered images are aligned. The one or more first processors send the information indicating the determined gaze direction of the one or more eyes of the wearer to the one or more second processors.

In some embodiments, the head mounted display device further includes one or more cameras. The one or more cameras detect a second portion of the visible light corresponding to the real images and send information representing the real images to the one or more second processors. In some embodiments, the second portion of visible light is reflected by the mirror toward the one or more cameras for detection.

In some embodiments, the head-mounted display device includes one or more actuators. The one or more actuators place one or more removable blocking layers between the one or more transparent displays and the mirror according to input signal that indicates a mode corresponding to the virtual reality contents. The one or more removable blocking layers transmit the infrared light reflected by the mirror toward the one or more eyes of the wearer and block at least the first portion of the visible light transmitted through the mirror so that the one or more transparent displays provide virtual reality contents according to a mode selected by the wearer. The input signal is inputted by the wearer to select a mode corresponding either the augmented reality contents or the virtual reality contents.

In accordance with some embodiments, a method for providing augmented reality contents to a wearer includes emitting infrared light from one or more infrared light sources. The emitted infrared light is reflected by a mirror toward one or more transparent displays so that the reflected infrared light is transmitted through the one or more transparent displays and one or more lenses toward one or more eyes of the wearer. The mirror is configured to reflect the infrared light and transmit at least a portion of visible light corresponding to the real images. The mirror is inclined at an angle from an optical axis of the one or more lenses. The method also includes detecting, with one or more sensors, infrared light reflected from the one or more eyes of the wearer for determining a gaze direction of the one or more eyes of the wearer. The infrared light reflected from the one or more eyes of the wearer is transmitted through the one or more lenses and the one or more transparent displays and reflected by the mirror toward the one or more sensors. The method further includes displaying rendered images based at least on the augmented reality contents for overlap with the real images on the one or more transparent displays coupled with the one or more lenses for projecting light toward one or more eyes of the wearer through the one or more lenses.

In some embodiments, the one or more transparent displays include organic light emitting diode displays.

In some embodiments, the method further includes transmitting the visible light corresponding to the real images through one or more additional lenses toward the one or more eyes of the wearer through the mirror and the one or more lenses.

In some embodiments, the one or more additional lenses are configured to offset a magnification of the real images caused by the one or more lenses.

In some embodiments, the method further includes determining the gaze direction of the one or more eyes of the wearer by one or more first processors based on the infrared light that is reflected from the one or more eyes of the wearer and detected by the one or more sensors.

In some embodiments, the method further includes sending information indicating the determined gaze direction of the one or more eyes of the wearer to one or more second processors.

In some embodiments, the method includes rendering the images by one or more second processors based on the information indicating the determined gaze direction of the one or more eyes of the wearer so that the real images and the rendered images are aligned.

In some embodiments, the method includes receiving an input signal to select a mode corresponding to either the augmented reality contents or virtual reality contents; and placing one or more removable blocking layers between the one or more transparent displays and the mirror when the mode corresponds to the virtual reality contents.

In some embodiments, the one or more removable blocking layers are configured to transmit the infrared light reflected by the mirror toward the one or more eyes of the wearer and block at least the portion of the visible light transmitted through the mirror, so that the one or more transparent displays provide images rendered based on the virtual reality contents according to the mode corresponding to the virtual reality contents.

BRIEF DESCRIPTION OF THE DRAWINGS

For a better understanding of the various described embodiments, reference should be made to the Description of Embodiments below, in conjunction with the following drawings in which like reference numerals refer to corresponding parts throughout the figures.

FIG. 3A is a schematic diagram illustrating a head-mounted display device in accordance with some embodiments.

FIG. 3B is a schematic diagram illustrating a head-mounted display device including the one or more additional lenses in accordance with some embodiments.

Reference will now be made to the exemplary embodiments illustrated, and specific language will be used herein to describe the same. It will nevertheless be understood that no limitation of the scope of the application is thereby intended.

These figures are not drawn to scale unless indicated otherwise.

DETAILED DESCRIPTION

Reference will now be made to embodiments, examples of which are illustrated in the accompanying drawings. In the following description, numerous specific details are set forth in order to provide an understanding of the various described embodiments. However, it will be apparent to one of ordinary skill in the art that the various described embodiments may be practiced without these specific details. In other instances, well-known methods, procedures, components, circuits, and networks have not been described in detail so as not to obscure aspects of the embodiments unnecessarily.

It will also be understood that, although the terms first, second, etc. are, in some instances, used herein to describe various elements, these elements should not be limited by these terms. These terms are used only to distinguish one element from another. For example, a first processor could be termed a second processor, and, similarly, a second processor could be termed a first processor, without departing from the scope of the various described embodiments. The first processor and the second processor are both processors, but they are not the same processor.

The terminology used in the description of the various described embodiments herein is for the purpose of describing particular embodiments only and is not intended to be limiting. As used in the description of the various described embodiments and the appended claims, the singular forms "a," "an," and "the" are intended to include the plural forms as well, unless the context indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "exemplary" is used herein in the sense of "serving as an example, instance, or illustration" and not in the sense of "representing the best of its kind."

Figure 1:
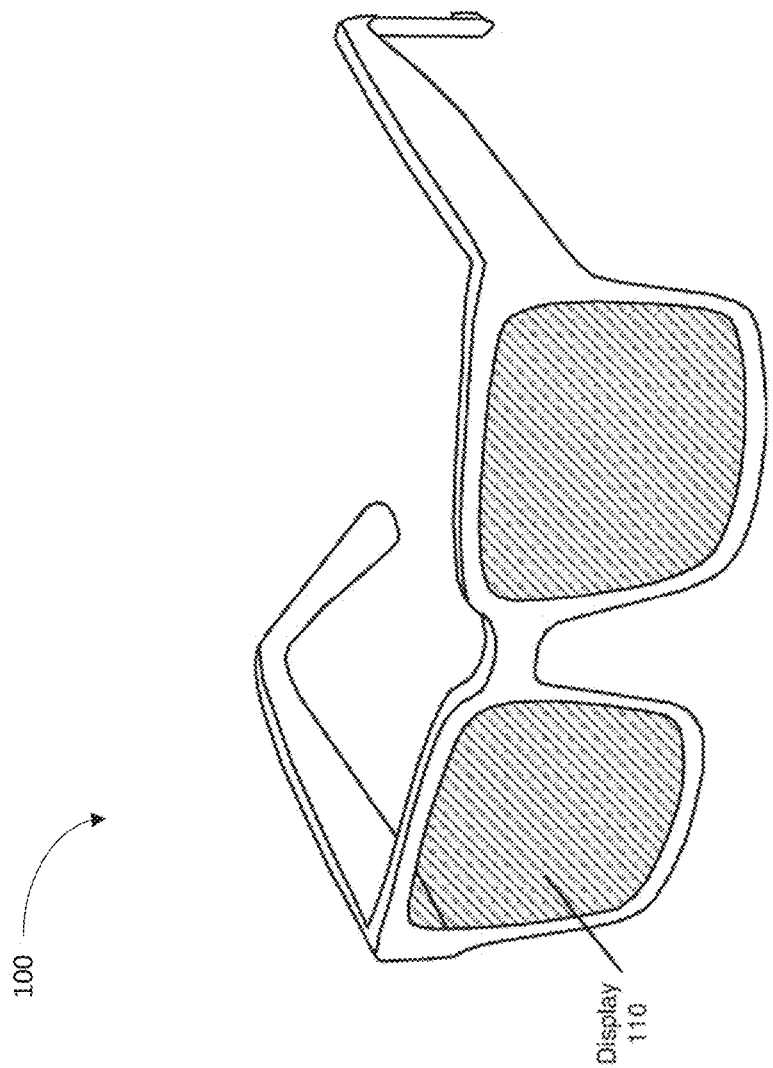
FIG. 1 is a perspective view of a display device in accordance with some embodiments.

FIG. 1 illustrates display device 100 in accordance with some embodiments. In some embodiments, display device 100 is configured to be worn on a head of a user (e.g., by having the form of spectacles or eyeglasses, as shown in FIG. 1) or to be included as part of a helmet that is to be worn by the user. When display device 100 is configured to be worn on a head of a user or to be included as part of a helmet, display device 100 is called a head-mounted display. Alternatively, display device 100 is configured for placement in proximity of an eye or eyes of the user at a fixed location, without being head-mounted (e.g., display device 100 is mounted in a vehicle, such as a car or an airplane, for placement in front of an eye or eyes of the user). As shown in FIG. 1, display device 100 includes display 110. Display 110 is configured for presenting visual contents (e.g., augmented reality contents, virtual reality contents, mixed reality contents, or any combination thereof) to a user.

In some embodiments, display device 100 includes one or more components described below with respect to FIG. 2. In some embodiments, display device 100 includes additional components not shown in FIG. 2.

Figure 2:
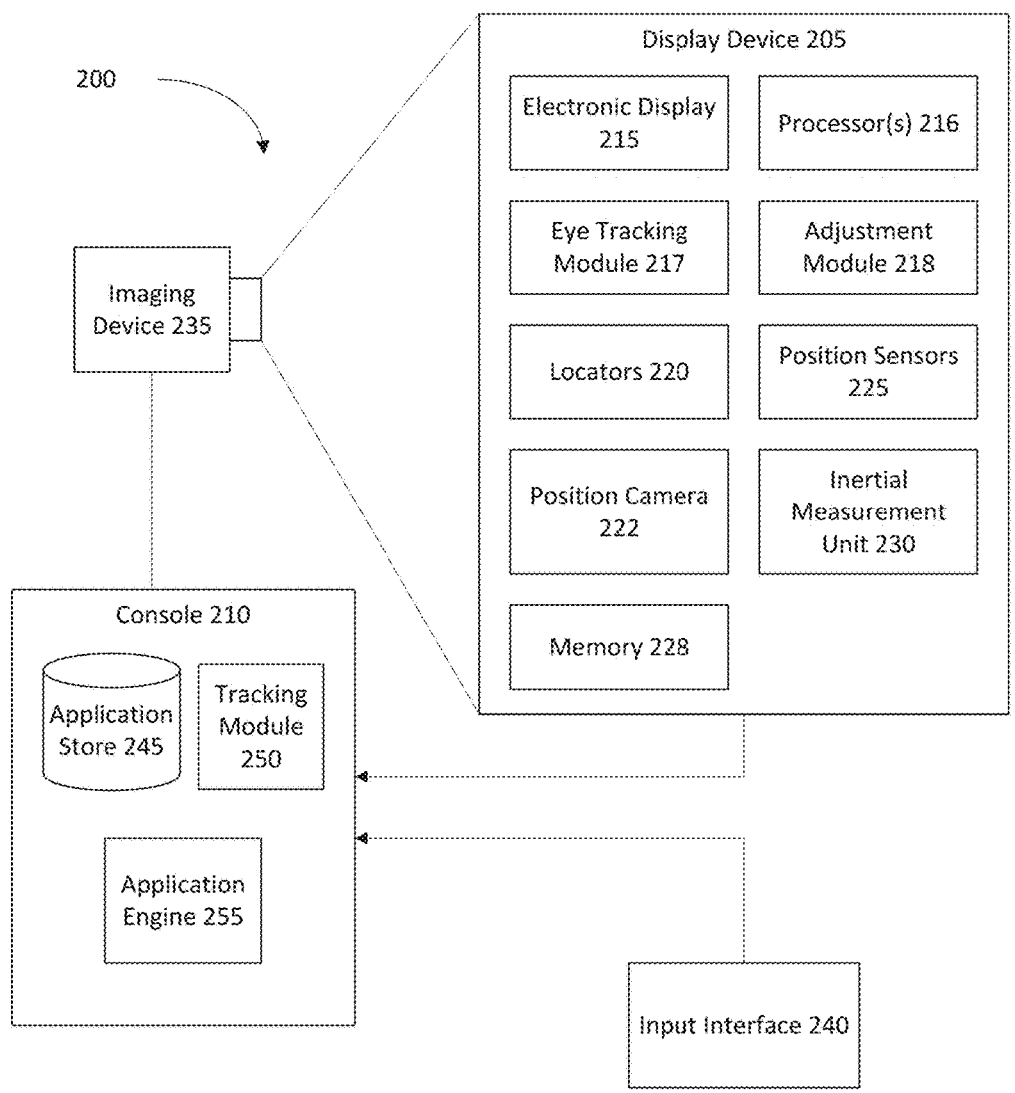
FIG. 2 is a block diagram of a system including a display device in accordance with some embodiments.

FIG. 2 is a block diagram of system 200 in accordance with some embodiments. The system 200 shown in FIG. 2 includes display device 205 (which corresponds to display device 100 shown in FIG. 1), imaging device 235, and input interface 240 that are each coupled to console 210. While FIG. 2 shows an example of system 200 including one display device 205, imaging device 235, and input interface 240, in other embodiments, any number of these components may be included in system 200. For example, there may be multiple display devices 205 each having associated input interface 240 and being monitored by one or more imaging devices 235, with each display device 205, input interface 240, and imaging devices 235 communicating with console 210. In alternative configurations, different and/or additional components may be included in system 200. For example, in some embodiments, console 210 is connected via a network (e.g., the Internet) to system 200 or is self-contained as part of display device 205 (e.g., physically located inside display device 205). In some embodiments, display device 205 is used to create mixed reality by adding in a view of the real surroundings. Thus, display device 205 and system 200 can deliver virtual reality, mixed reality, and augmented reality.

In some embodiments, as shown in FIG. 1, display device 205 is a head-mounted display that presents media to a user. Examples of media presented by display device 205 include one or more of images, video, audio, or some combination thereof. In some embodiments, audio is presented via an external device (e.g., speakers and/or headphones) that receives audio information from display device 205, console 210, or both, and presents audio data based on the audio information. In some embodiments, display device 205 immerses a user in a virtual environment.

In some embodiments, display device 205 also acts as an augmented reality (AR) headset. In these embodiments, display device 205 augments views of a physical, real-world environment with computer-generated elements (e.g., images, video, sound, etc.). Moreover, in some embodiments, display device 205 is able to cycle between different types of operation. Thus, display device 205 may operate as a virtual reality (VR) device, an AR device, as glasses, or as some combination thereof (e.g., glasses with no optical correction, glasses optically corrected for the user, sunglasses, or some combination thereof) based on instructions from application engine 255.

Display device 205 includes electronic display 215, one or more processors 216, eye tracking module 217, adjustment module 218, one or more locators 220, one or more position sensors 225, one or more position cameras 222, memory 228, inertial measurement unit (IMU) 230, one or more reflective elements 260 or a subset or superset thereof (e.g., display device 205 with electronic display 215, one or more processors 216, and memory 228, without any other listed components). Some embodiments of display device 205 have different modules than those described here. Similarly, the functions can be distributed among the modules in a different manner than is described here.

One or more processors 216 (e.g., processing units or cores) execute instructions stored in memory 228. Memory 228 includes high-speed random access memory, such as DRAM, SRAM, DDR RAM, or other random access solid state memory devices; and may include non-volatile memory, such as one or more magnetic disk storage devices, optical disk storage devices, flash memory devices, or other non-volatile solid state storage devices. Memory 228, or alternately the non-volatile memory device(s) within memory 228, includes a non-transitory computer readable storage medium. In some embodiments, memory 228 or the computer readable storage medium of memory 228 stores programs, modules, data structures, and/or instructions for displaying one or more images on electronic display 215.

Electronic display 215 displays images to the user in accordance with data received from console 210 and/or processor(s) 216. In various embodiments, electronic display 215 may comprise a single adjustable display element or multiple adjustable display elements (e.g., a display for each eye of a user). In some embodiments, electronic display 215 is configured to display images to the user by projecting the images onto one or more reflective elements 260.

In some embodiments, the display element includes one or more light emission devices and a corresponding emission intensity array. An emission intensity array is an array of electro-optic pixels, opto-electronic pixels, some other array of devices that dynamically adjust the amount of light transmitted by each device, or some combination thereof. These pixels are placed behind one or more lenses. In some embodiments, the emission intensity array is an array of liquid crystal based pixels in an LCD (a Liquid Crystal Display). Examples of the light emission devices include: an organic light emitting diode, an active-matrix organic light-emitting diode, a light emitting diode, a laser, a fluorescent light source, some type of device capable of being placed in a flexible display, or some combination thereof. The light emission devices include devices that are capable of generating visible light (e.g., red, green, blue, etc.) used for image generation. The emission intensity array is configured to selectively attenuate individual light emission devices, groups of light emission devices, or some combination thereof. Alternatively, when the light emission devices are configured to selectively attenuate individual emission devices and/or groups of light emission devices, the display element includes an array of such light emission devices without a separate emission intensity array. In some embodiments, electronic display 215 projects images to one or more reflective elements 260, which reflect at least a portion of the light toward an eye of a user.

One or more lenses direct light from the arrays of light emission devices (optionally through the emission intensity arrays) to locations within each eyebox and ultimately to the back of the user's retina(s). An eyebox is a region that is occupied by an eye of a user located in proximity to display device 205 (e.g., a user wearing display device 205) for viewing images from display device 205. In some cases, the eyebox is represented as a 10 mm×10 mm square. In some embodiments, the one or more lenses include one or more coatings, such as anti-reflective coatings.

In some embodiments, the display element includes an infrared (IR) detector array that detects IR light that is retro-reflected from the retinas of a viewing user, from the surface of the corneas, lenses of the eyes, or some combination thereof. The IR detector array includes an IR sensor or a plurality of IR sensors that each correspond to a different position of a pupil of the viewing user's eye. In alternate embodiments, other and/or additional eye tracking systems may be employed.

Eye tracking module 217 determines locations of each pupil of a user's eyes. In some embodiments, eye tracking module 217 instructs electronic display 215 to illuminate the eyebox with IR light (e.g., via IR emission devices in the display element).

A portion of the emitted IR light will pass through the viewing user's pupil and be retro-reflected from the retina toward the IR detector array, which is used for determining the location of the pupil. Alternatively, reflections off of the surfaces of the eye may also be used to determine the location of the pupil. The IR detector array scans for retro-reflection and identifies which IR emission devices are active when retro-reflection is detected. Eye tracking module 217 may use a tracking lookup table and the identified IR emission devices to determine the pupil locations for each eye. The tracking lookup table maps received signals on the IR detector array to locations (corresponding to pupil locations) in each eyebox. In some embodiments, the tracking lookup table is generated via a calibration procedure (e.g., user looks at various known reference points in an image and eye tracking module 217 maps the locations of the user's pupil while looking at the reference points to corresponding signals received on the IR tracking array). As mentioned above, in some embodiments, system 200 may use other eye tracking systems than the embedded IR one described above. In some embodiments, the eye tracking uses near-infrared light (NIR) instead of IR light.

Adjustment module 218 generates an image frame based on the determined locations of the pupils. In some embodiments, this sends a discrete image to the display that will tile subimages together, thus, a coherent stitched image will appear on the back of the retina. Adjustment module 218 adjusts an output (i.e. the generated image frame) of electronic display 215 based on the detected locations of the pupils. Adjustment module 218 instructs portions of electronic display 215 to pass image light to the determined locations of the pupils. In some embodiments, adjustment module 218 also instructs the electronic display not to pass image light to positions other than the determined locations of the pupils. Adjustment module 218 may, for example, block and/or stop light emission devices whose image light falls outside of the determined pupil locations, allow other light emission devices to emit image light that falls within the determined pupil locations, translate and/or rotate one or more display elements, dynamically adjust curvature and/or refractive power of one or more active lenses in the lens (e.g., microlens) arrays, or some combination thereof.

Optional locators 220 are objects located in specific positions on display device 205 relative to one another and relative to a specific reference point on display device 205. A locator 220 may be a light emitting diode (LED), a corner cube reflector, a reflective marker, a type of light source that contrasts with an environment in which display device 205 operates, or some combination thereof. In embodiments where locators 220 are active (i.e., an LED or other type of light emitting device), locators 220 may emit light in the visible band (e.g., about 400 nm to 750 nm), in the infrared band (e.g., about 750 nm to 1 mm), in the ultraviolet band (about 100 nm to 400 nm), some other portion of the electromagnetic spectrum, or some combination thereof.

In some embodiments, locators 220 are located beneath an outer surface of display device 205, which is transparent to the wavelengths of light emitted or reflected by locators 220 or is thin enough not to substantially attenuate the wavelengths of light emitted or reflected by locators 220. Additionally, in some embodiments, the outer surface or other portions of display device 205 are opaque in the visible band of wavelengths of light. Thus, locators 220 may emit light in the IR band under an outer surface that is transparent in the IR band but opaque in the visible band.

Inertial Measurement Unit (IMU) 230 is an electronic device that generates calibration data based on measurement signals received from one or more position sensors 225. Position sensor 225 generates one or more measurement signals in response to motion of display device 205. Examples of position sensors 225 include: one or more accelerometers, one or more gyroscopes, one or more magnetometers, another suitable type of sensor that detects motion, a type of sensor used for error correction of IMU 230, or some combination thereof. Position sensors 225 may be located external to IMU 230, internal to IMU 230, or some combination thereof.

Based on the one or more measurement signals from one or more position sensors 225, IMU 230 generates first calibration data indicating an estimated position of display device 205 relative to an initial position of display device 205. For example, position sensors 225 include multiple accelerometers to measure translational motion (forward/back, up/down, left/right) and multiple gyroscopes to measure rotational motion (e.g., pitch, yaw, roll). In some embodiments, IMU 230 samples the measurement signals and calculates the estimated position of display device 205 from the sampled data. For example, IMU 230 integrates the measurement signals received from the accelerometers over time to estimate a velocity vector and integrates the velocity vector over time to determine an estimated position of a reference point on display device 205. Alternatively, IMU 230 provides the sampled measurement signals to console 210, which determines the first calibration data. The reference point is a point that may be used to describe the position of display device 205. While the reference point may generally be defined as a point in space, in practice the reference point is defined as a point within display device 205 (e.g., a center of IMU 230).

In some embodiments, IMU 230 receives one or more calibration parameters from console 210. As further discussed below, the one or more calibration parameters are used to maintain tracking of display device 205. Based on a received calibration parameter, IMU 230 may adjust one or more IMU parameters (e.g., sample rate). In some embodiments, certain calibration parameters cause IMU 230 to update an initial position of the reference point so that it corresponds to a next calibrated position of the reference point. Updating the initial position of the reference point as the next calibrated position of the reference point helps reduce accumulated error associated with the determined estimated position. The accumulated error, also referred to as drift error, causes the estimated position of the reference point to "drift" away from the actual position of the reference point over time.

Imaging device 235 generates calibration data in accordance with calibration parameters received from console 210. Calibration data includes one or more images showing observed positions of locators 220 that are detectable by imaging device 235. In some embodiments, imaging device 235 includes one or more still cameras, one or more video cameras, any other device capable of capturing images including one or more locators 220, or some combination thereof. Additionally, imaging device 235 may include one or more filters (e.g., used to increase signal to noise ratio). Optionally, imaging device 235 is configured to detect light emitted or reflected from locators 220 in a field of view of imaging device 235. In embodiments where locators 220 include passive elements (e.g., a retroreflector), imaging device 235 may include a light source that illuminates some or all of locators 220, which retro-reflect the light towards the light source in imaging device 235. Second calibration data is communicated from imaging device 235 to console 210, and imaging device 235 receives one or more calibration parameters from console 210 to adjust one or more imaging parameters (e.g., focal length, focus, frame rate, ISO, sensor temperature, shutter speed, aperture, etc.).

In some embodiments, display device 205 includes one or more reflective elements 260. In some embodiments, electronic display device 205 includes a single reflective element 260 or multiple reflective elements 260 (e.g., a reflective element 260 for each eye of a user). In some embodiments, electronic display device 215 projects computer-generated images on one or more reflective elements 260, which then reflects the images toward user's eye. The computer-generated images include still images, animated images, and/or a combination thereof. The computer-generated images include objects that appear to be two-dimensional and/or three-dimensional objects. In some embodiments, one or more reflective elements 260 are partially transparent (e.g., the one or more reflective elements 260 have a transmittance of at least 15%), which allows transmission of ambient light. In such embodiments, computer-generated images projected by electronic display 215 are superimposed with the transmitted ambient light (e.g., transmitted ambient image) to provide augmented reality images.

Input interface 240 is a device that allows a user to send action requests to console 210. An action request is a request to perform a particular action. For example, an action request may be to start or end an application or to perform a particular action within the application. Input interface 240 may include one or more input devices. Example input devices include: a keyboard, a mouse, a game controller, a touch controller, data from brain signals, data from other parts of the human body, or any other suitable device for receiving action requests and communicating the received action requests to console 210. An action request received by input interface 240 is communicated to console 210, which performs an action corresponding to the action request. In some embodiments, input interface 240 may provide haptic feedback to the user in accordance with instructions received from console 210. For example, haptic feedback is provided when an action request is received, or console 210 communicates instructions to input interface 240 causing input interface 240 to generate haptic feedback when console 210 performs an action.

Console 210 provides media to display device 205 for presentation to the user in accordance with information received from one or more of: imaging device 235, display device 205, and input interface 240. In the example shown in FIG. 2, console 210 includes application store 245, tracking module 250, and application engine 255. Some embodiments of console 210 have different modules than those described in conjunction with FIG. 2. Similarly, the functions further described below may be distributed among components of console 210 in a different manner than is described here.

When application store 245 is included in console 210, application store 245 stores one or more applications for execution by console 210. An application is a group of instructions, that when executed by a processor, is used for generating content for presentation to the user. Content generated by the processor based on an application may be in response to inputs received from the user via movement of display device 205 or input interface 240. Examples of applications include: gaming applications, conferencing applications, educational applications, video playback application, or other suitable applications.

When tracking module 250 is included in console 210, tracking module 250 calibrates system 200 using one or more calibration parameters and may adjust one or more calibration parameters to reduce error in determination of the position of display device 205. For example, tracking module 250 adjusts the focus of imaging device 235 to obtain a more accurate position for observed locators on display device 205. Moreover, calibration performed by tracking module 250 also accounts for information received from IMU 230. Additionally, if tracking of display device 205 is lost (e.g., imaging device 235 loses line of sight of at least a threshold number of locators 220), tracking module 250 re-calibrates some or all of system 200.

In some embodiments, tracking module 250 tracks movements of display device 205 using second calibration data from imaging device 235. For example, tracking module 250 determines positions of a reference point of display device 205 using observed locators from the second calibration data and a model of display device 205. In some embodiments, tracking module 250 also determines positions of a reference point of display device 205 using position information from the first calibration data. Additionally, in some embodiments, tracking module 250 may use portions of the first calibration data, the second calibration data, or some combination thereof, to predict a future location of display device 205. Tracking module 250 provides the estimated or predicted future position of display device 205 to application engine 255.

Application engine 255 executes applications within system 200 and receives position information, acceleration information, velocity information, predicted future positions, or some combination thereof of display device 205 from tracking module 250. Based on the received information, application engine 255 determines content to provide to display device 205 for presentation to the user. For example, if the received information indicates that the user has looked to the left, application engine 255 generates content for display device 205 that mirrors the user's movement in a virtual environment. Additionally, application engine 255 performs an action within an application executing on console 210 in response to an action request received from input interface 240 and provides feedback to the user that the action was performed. The provided feedback may be visual or audible feedback via display device 205 or haptic feedback via input interface 240.

FIG. 3A is a schematic diagram illustrating a head-mounted display device in accordance with some embodiments.

The head-mounted display device in accordance with some embodiments includes one or more lenses 310, one or more transparent displays 320, a mirror 322, one or more infrared light sources 330 and one or more sensors 340. The specific details of each element are as follows.

For purpose of the illustration, one or more eyes of a wearer are illustrated as a single eye 350 in FIG. 3A.

One or more lenses 310, as illustrated in FIG. 3A, are located in front of the one or more transparent displays 320 to transmit visible light toward the one or more eyes 350 of the wearer. The one or more lenses 310 include at least one convex lens, at least one concave lens, at least one convex-concave lens, or any combination thereof.

In some embodiments, the one or more transparent displays 320 comprise only a single contiguous display (e.g., the single contiguous display projects light for both left and right eyes). In some embodiments, the one or more transparent displays 320 include two separate displays (e.g., a first display for a left eye and a second display for a right eye). In some embodiments, the one or more transparent displays 320 include three or more displays (e.g., three or more distinct and separate displays, such as four distinct and separate displays that are stitched together to operate as a display element for the head-mounted display device). For purpose of the illustration, the one or more transparent displays 320 are shown as a single rectangular block in FIG. 3A. However, the one or more transparent displays 320 need not be contiguous, as described above.

In some embodiments, one or more transparent displays 320 include one or more organic light emitting diode displays (OLED). An organic light emitting diode display typically includes one or more organic compounds that emit light in response to an electric current. Thus, in some embodiments, the one or more organic light emitting diode displays do not include a backlight. In some embodiments, the one or more organic compounds are located between transparent electrodes (e.g., indium tin oxide) located on transparent substrates (e.g., glass substrates). This improves the transparency (or transmittance) of the one or more transparent displays 320.

The one or more transparent displays 320 are coupled (e.g., optically coupled) with the one or more lenses 310 for projecting light toward the one or more eyes 350 of the wearer through the one or more lenses 310. In some embodiments, the head-mounted display device displays images rendered based at least on the augmented reality contents for overlap with real images on the one or more transparent displays 320 (e.g., the light projected by the one or more transparent displays 320 corresponds to the rendered images). In some embodiments, the one or more transparent displays are substantially transparent to visible light and infrared light (e.g., >80% transmittance). For example, light emerging from an object located behind the one or more transparent displays 320 is transmitted through the one or more transparent displays 320 with 80% or higher transmittance. In some embodiments, the one or more transparent displays have 90% or higher transmittance, 70% or higher transmittance, 60% or higher transmittance, or 50% or higher transmittance for visible light and infrared light.

In some embodiments, the mirror 322 is a hot mirror (e.g., the mirror 322 reflects infrared light and transmits visible light 360 corresponding to the real images). In some embodiments, the mirror 322 is highly transparent to visible light. In some embodiments, the mirror 322 is a cold mirror. In FIG. 3A, the mirror 322 is inclined at an angle from an optical axis of the one or more lenses 310 (e.g., the mirror 322 is inclined 45° from the optical axis of the one or more lenses 310). In some embodiments, the angle is not fixed and changeable. For example, the mirror 322 can be inclined 30° or 60° from the optical axis of the one or more lenses 310. The mirror 322 transmits a substantial portion of visible light 360 provided from outside the display device (e.g., ambient light) toward the one or more transparent displays 320 and reflects a portion of visible light corresponding to the real images. In some embodiments, the portion of visible light reflected by the mirror 322 is less than 10% of the visible light 360 corresponding to the real images.

For purpose of illustration, the one or more infrared light sources 330 are shown as a single block in FIG. 3A. However, the one or more infrared light sources 330 need not be contiguous (e.g., in some cases, the one or more infrared light sources 330 include a first infrared light source and a second infrared light source that is distinct and separate from the first infrared light source). In some embodiments, the one or more infrared light sources 330 includes a plurality of infrared light sources for projecting a particular pattern of infrared light over a particular area of the eye 350.

The one or more infrared light sources 330 emit infrared light toward the mirror 322. The one or more infrared light sources 330 are located next to (or attached to) the one or more sensors 340. The mirror 322 reflects the infrared light emitted from the one or more infrared light sources 330 toward the one or more transparent displays 320. The reflected infrared light is transmitted through the one or more transparent displays 320 and the one or more lenses 310 toward the one or more eyes 350 of the wearer. Subsequently, at least a portion of the transmitted infrared light is reflected from the one or more eyes 350 of the wearer (e.g., a portion of the transmitted infrared light is reflected by a retina, a sclera, an iris, and/or a lens of an eye 350) and the infrared light reflected from the one or more eyes 350 of the wearer is transmitted through the one or more lenses 310 and the one or more transparent displays 320, and reflected by the mirror 322 toward the one or more sensors 340.

The one or more sensors 340 detect the infrared light reflected by the mirror 322 for determining a gaze direction of the one or more eyes 350 of the wearer (e.g., based on the intensity of the infrared light received by the one or more sensors 340, it is determined whether the infrared light is reflected by a retina, an iris, or a sclera of an eye 350). For purpose of illustration, the one or more infrared light sources 330 are shown as a single block and the one or more sensors 340 are shown as a single block in FIG. 3A. However, the one or more sensors 340 need not be contiguous (e.g., in some cases, the one or more sensors 340 include a first sensor and a second sensor that is distinct and separate from the first sensor). In some embodiments, the one or more sensors 340 include an array of multiple sensors (e.g., a two-dimensional array of sensors) for receiving infrared light reflected from a particular area of the eye 350.

FIG. 3B is a schematic diagram illustrating a head-mounted display device including the one or more additional lenses in accordance with some embodiments.

In some embodiments, the head-mounted display device includes one or more lenses 310, one or more transparent displays 320, a mirror 322, one or more infrared light sources 330, one or more sensors 340 and one or more additional lenses 324. The head-mounted display devices described in FIG. 3A and FIG. 3B are similar except for the one or more additional lenses 324 shown in FIG. 3B. The detailed descriptions of the elements described with respect to FIG. 3A are not repeated herein.

The visible light 360 corresponding to the real image is provided from an outside of the device. The one or more additional lenses 324 are configured for transmitting the visible light corresponding to the real images to the mirror 322. In some embodiments, each of one or more additional lenses 324 is thinner than each of one or more lenses 310. As described above, in some embodiments, a significant portion (e.g., >90%) of the visible light 360 transmitted through the one or more additional lenses 324 pass through the mirror 322, and less than 10% visible light is reflected by the mirror 322. In some embodiments, the one or more additional lenses 324 offset a magnification of the real images, which is caused by the one or more lenses 310 to provide the wearer with real images on a real scale (e.g., without significant magnification or demagnification). In some embodiments, the one or more additional lenses 324 are configured to focus the real images onto the one or more transparent displays 320.

Figure 3C:
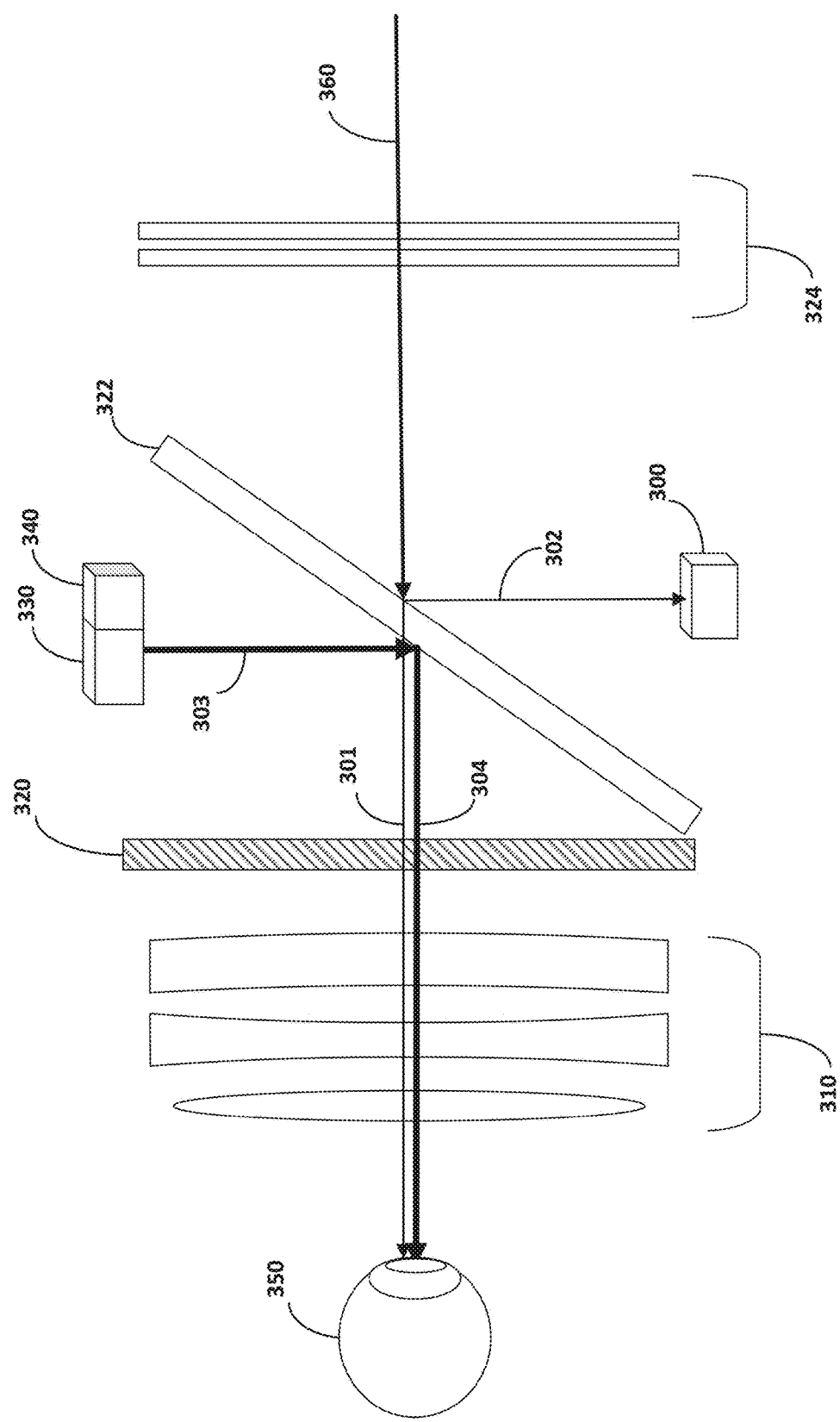
FIG. 3C is a schematic diagram illustrating flows of visible light and infrared light emitted from one or more sensors in accordance with some embodiments.

FIG. 3C is a schematic diagram illustrating flows of visible light and infrared light emitted from one or more sensors in accordance with some embodiments.

In some embodiments, the head-mounted display device includes one or more lenses 310, one or more transparent displays 320, a mirror 322, one or more infrared light sources 330, one or more sensors 340, one or more additional lenses 324, and one or more cameras 300. The head-mounted display devices described in FIG. 3B and FIG. 3C are similar except for the one or more cameras 300 shown in FIG. 3C. The detailed descriptions of the elements described with respect to FIG. 3B are not repeated herein.

As shown in FIG. 3C, when the visible light 360 corresponding to the real images is provided from the outside of the device, the one or more additional lenses 324 transmit the visible light 360. The mirror 322 as described above with reference to FIGS. 3A-3B is substantially transparent to the visible light 360 and reflects a portion of the visible light. Hereinafter a portion of the visible light passing through the mirror 322 is referred to as a first portion 301 of the visible light and a portion of the visible light reflected by the mirror 322 is referred to as a second portion 302 of the visible light. The first portion 301 of the visible light and the second portion 302 of the visible light correspond to same real images, respectively. After passing through the mirror 322, the first portion 301 of the visible light is transmitted through the one or more transparent displays 320 and one or more lenses 310 toward the one or more eyes 350 of the wearer. When the second portion 302 of the visible light is reflected by the mirror 322 toward one or more cameras 300, the one or more cameras 300 detect the second portion 302 of the visible light reflected by the mirror 322. Information representing the real images corresponding to the detected second portion of visible light is used for rendering images based on the augmented reality contents. The rendered images are provided to the wearer as being aligned with the real images.

As one or more infrared light sources 330 emit infrared light 303 toward the mirror 322, the mirror 322 reflects the infrared light 303 toward the one or more eyes 350 of the wearer. The reflected infrared light 304 passes through one or more transparent displays 320 and one or more lenses 310, and subsequently reaches the one or more eyes 350 of the wearer.

Figure 4:
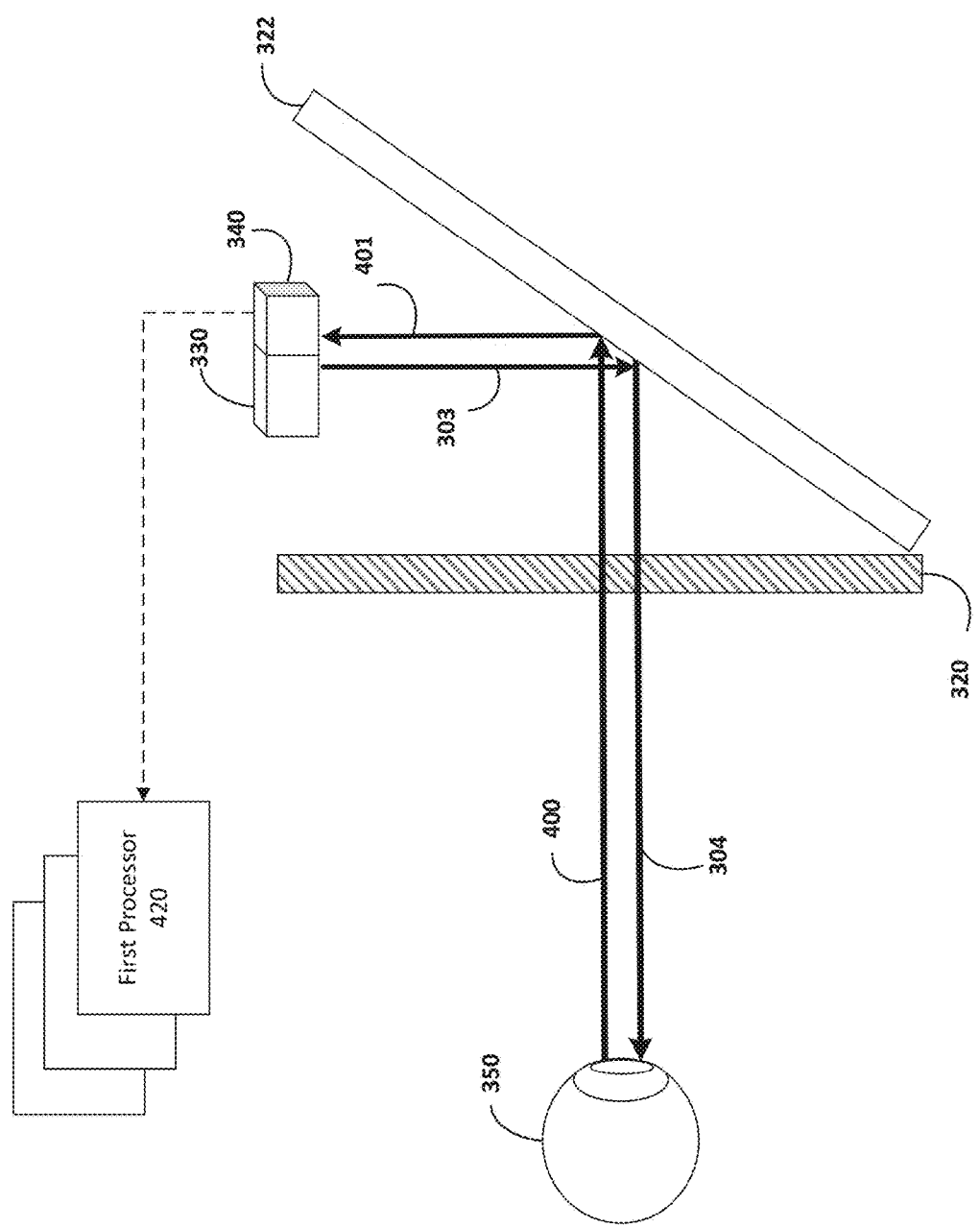
FIG. 4 illustrates an operation of a head-mounted display device to determine a gaze direction of one or more eyes of a wearer in accordance with some embodiments.

FIG. 4 illustrates an operation of a head-mounted display device to determine a gaze direction of one or more eyes of a wearer in accordance with some embodiments.

In some embodiments, the head-mounted display device further includes one or more first processors 420 to determine the gaze direction based on the detected infrared light.

As above described, the infrared light 303 emitted from the one or more infrared light sources 330 is used to determine the gaze direction of the one or more eyes 350 of the wearer. When the one or more infrared light sources 330 emit infrared light 303, the emitted infrared light 303 is reflected by the mirror 322 toward the one or more eyes 350 of the wearer, and subsequently passes through the one or more eyes 350 of the wearer. After the infrared light 400 is reflected from the one or more eyes 350 of the wearer toward the transparent displays 320, the infrared light 400 is reflected by the mirror 322, and subsequently, the one or more sensors 340 detect the infrared light 401 reflected by the mirror 322.

In a conventional head-mounted display device with a large assembly of lenses located in front of the display, the conventional head-mounted display device has an insufficient space, in front of the display, for an eye tracking sensor. As a result, the conventional head-mounted display device may include an eye tracking sensor at an off-angle position (e.g., at a tilted angle), which contributes to an increased aberrations and reduced accuracy in eye tracking. By utilizing the space behind the one or more transparent displays 320, this application provides not only an accurate eye tracking function but also a more compact and lighter head-mounted display device. The one or more sensors 340 in accordance with some embodiments are placed between the one or more transparent displays 320 and the mirror 322 (or above the space between the one or more transparent displays 320 and the mirror 322). Since the mirror 322 is inclined at an angle, the mirror 322 reflects the infrared light 400 that has returned substantially along the path of the infrared light 304. This positioning of the one or more sensors 340 allows detection of the infrared light reflected from the one or more eyes 350 with reduced aberration, which, in turn, allows accurate determination of a gaze direction of the one or more eyes 350 of the wearer.

The one or more sensors 340 send information corresponding the detected infrared light 401 (e.g., information representing an intensity of the detected infrared light 401 or an intensity profile of the detected infrared light 401) to one or more first processors 420. The one or more first processors 420 determine the gaze direction of the one or more eyes 350 of the wearer based on the detected infrared light 401. In some embodiments, in accordance with a determination that the intensity the detected infrared light 401 is greater than a predefined threshold, the one or more first processors 420 determine that the eye 350 is gazing forward (e.g., due to the high reflectance of the retina of the eye 350). In some embodiments, in accordance with a determination that the intensity the detected infrared light 401 is less than the predefined threshold, the one or more first processors 420 determine that the eye 350 is looking sideways (e.g., due to the low reflectance of the sclera of the eye 350).

Figure 5A:
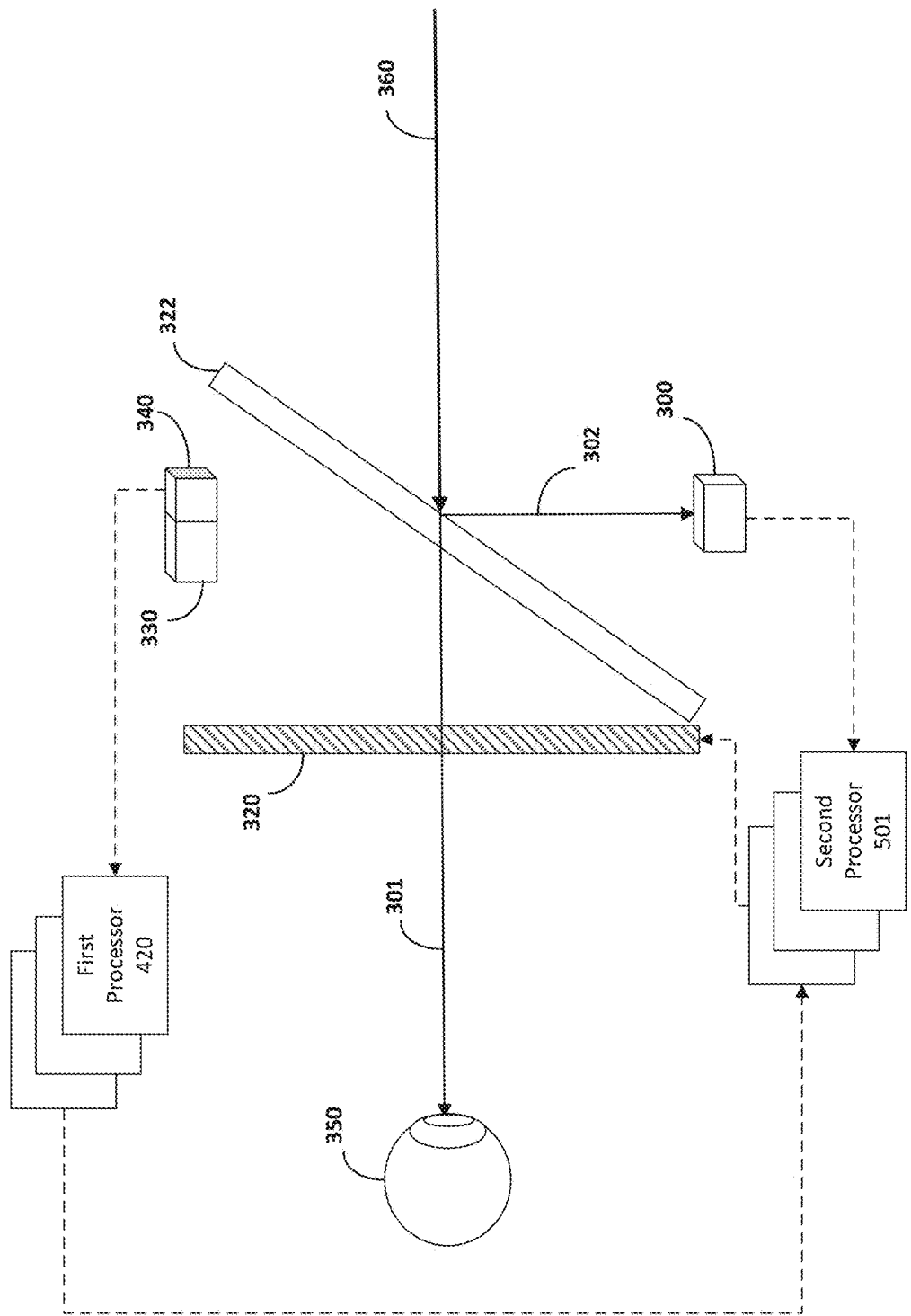
FIGS. 5A and 5B illustrate an operation of a head-mounted display device to render images based on augmented contents in accordance with some embodiments.

FIG. 5A illustrates an operation of a head-mounted display device to render images based on augmented contents in accordance with some embodiments.

In some embodiments, the head-mounted display device further includes one or more second processors 501 to render the images based on the augmented contents.

Although the one or more first processors 420 and the one or more second processors 501 are shown as separate blocks in FIG. 5A, in some embodiments, the one or more first processors 420 and the one or more second processors 501 can be included and operated in one or more processors. In this case, the one or more first processors 420 and the one or more second processors 501 are referred to as a processor or one or more processor.

As described above with reference to FIG. 4, when the one or more sensors 340 send information corresponding to the detected infrared light 401 to one or more first processors 420, the one or more first processors 420 determine the gaze direction of the one or more eyes 350 of the wearer and send information indicating the determined gaze direction of the one or more eyes 350 of the wearer to the one or more second processors 501.

While the one or more first processors send the information indicating the determined gaze direction of the one or more eyes 350 of the wearer to the one or more second processors 501, the one or more cameras 300 as described above with reference to FIG. 3C detect the second portion 302 of the visible light reflected by the mirror 322 and send the information representing the real images corresponding to the detected second portion of visible light to the one or more second processors 501.

Figure 5B:
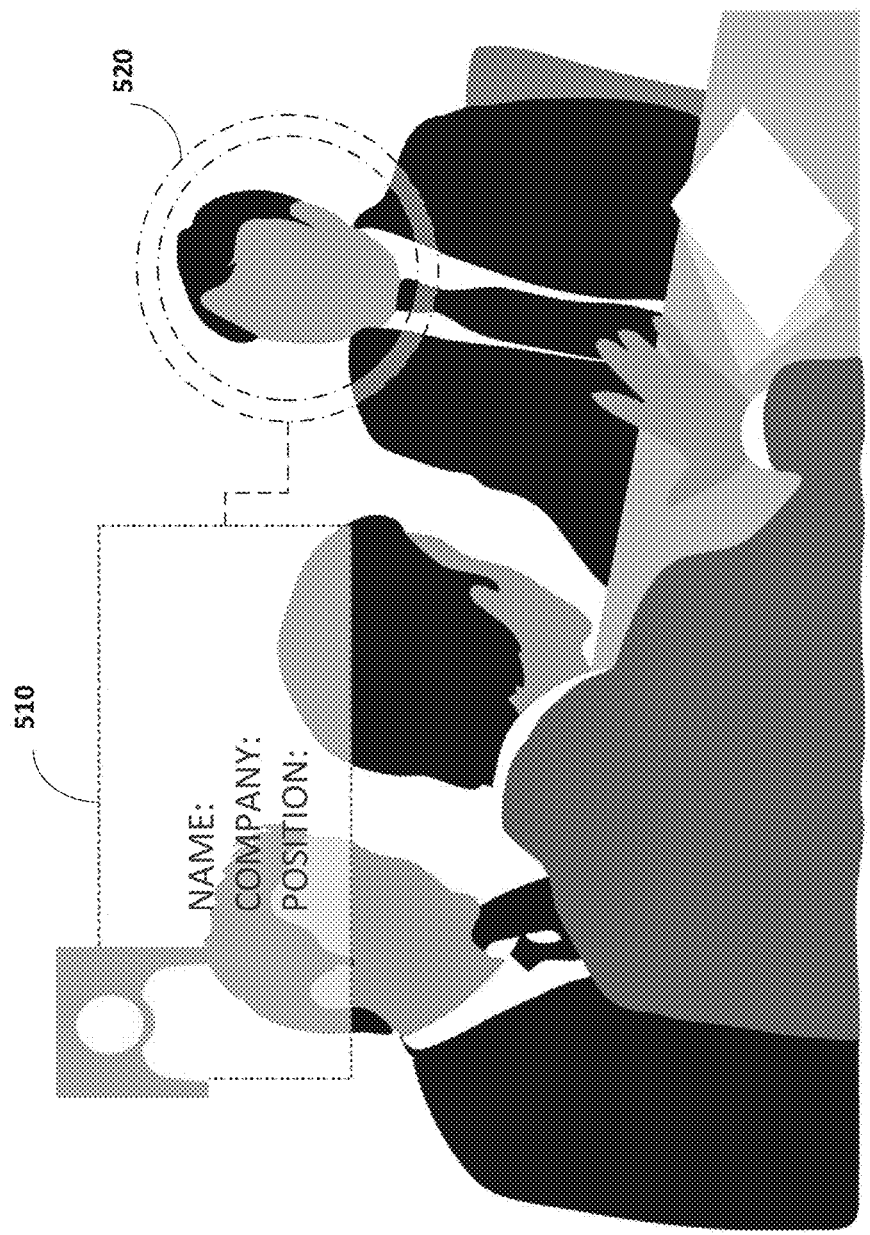

The one or more second processors 501 renders images based on the received information representing real images and the information indicating the determined gaze direction of the one or more eyes 350 of the wearer, as shown in FIG. 5B.

FIG. 5B illustrates an overlap of a real image and an image rendered based at least on augmented reality contents in accordance with some embodiments. In FIG. 5B, the real image of three people is transmitted through the one or more transparent displays. FIG. 5B also illustrates gaze indicator 520 displayed by the one or more transparent displays, where the position of gaze indicator 520 is determined based on the gaze direction of the one or more eyes of the wearer (e.g., the gaze direction is determined using infrared light reflected from the one or more eyes of the wearer as explained above with respect to FIG. 4). For example, gaze indicator 520 is positioned at a location that corresponds to the gaze direction of the one or more eyes of the wearer (e.g., gaze indicator 520 is positioned over a person or an object that one or more eyes of the wearer are gazing at). In some embodiments, the one or more transparent displays project light to provide an image based on augmented reality content 510 (e.g., name, company, position, etc. of a person that the one or more eyes of the wearer are gazing at).

After (at least partially) rendering renders images based on the received information representing real images and the information indicating the determined gaze direction of the one or more eyes 350 of the wearer, the one or more second processors 501 send the rendered images to the one or more transparent displays 320 to display the rendered images in alignment with the real images.

Figure 6:
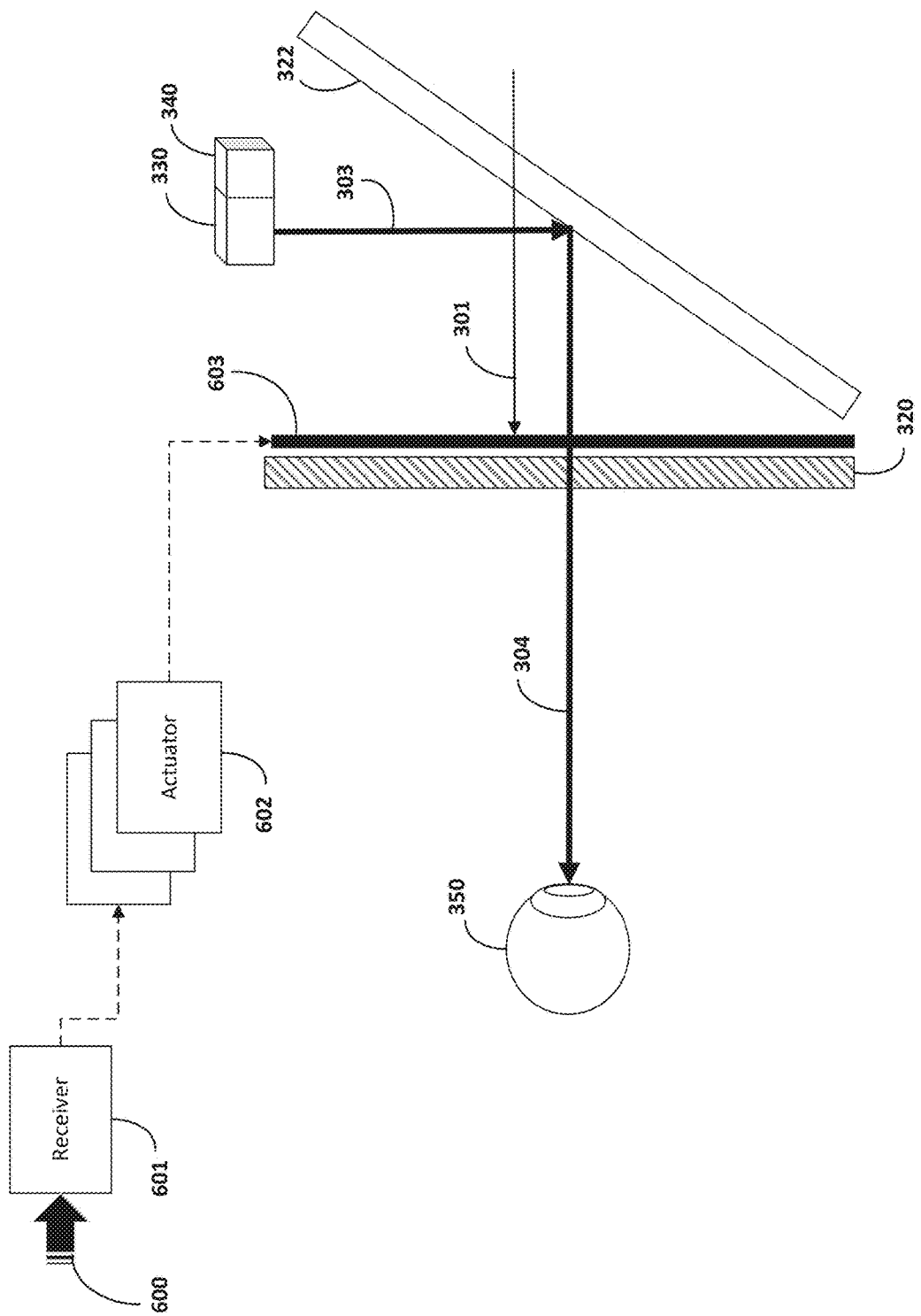
FIG. 6 illustrates an operation of a head-mounted display device for providing the virtual reality contents in accordance with some embodiments.

FIG. 6 illustrates an operation of a head-mounted display device for providing the virtual reality contents in accordance with some embodiments. In FIG. 6, the one or more lenses 310 shown in FIGS. 3A-3C are not shown so as not to obscure other aspects of the head-mounted display device described with respect to FIG. 6. However, the head-mounted display device shown in FIG. 6, in some embodiments, includes the one or more lenses 310.

In some embodiments, the head-mounted display device further includes a receiver 601 to receive an input signal 601 to select a mode corresponding to either the augmented reality contents or the virtual reality contents.

In accordance with the receiver 601 receiving the input signal 601 selecting a mode corresponding to the virtual reality contents, the receiver 601 instructs one or more actuators 602 to place one or more removable blocking layers 603 between the one or more transparent displays 320 and the mirror 322. For the purpose of illustration, the one or more removable blocking layers 603 are shown as a single rectangular block in FIG. 6.

In some embodiments, the one or more removable blocking layers 603 include black colored films. The one or more removable blocking layers 603 are configured to block the visible light provided from the outside of the device. This facilitate providing the virtual reality contents, as the virtual reality contents displayed by the one or more transparent displays 320 are not interfered with the visible light from the outside of the device. As shown in FIG. 6, the one or more removable blocking layers 603 are transparent to the infrared light so that the infrared light 304 reflected by the mirror 322 is transmitted through the one or more removable blocking layers 603 toward the one or more eyes 350 of the wearer while the first portion 301 of the visible light passing through the mirror 322 is blocked by the one or more removable blocking layers 603.

In accordance with the receiver 601 receiving an input signal selecting a mode corresponding to the augmented reality contents from the wearer, the receiver 601 instructs the one or more actuators 602 to remove the inserted one or more blocking layers 603. This allows the first portion 301 of the visible light to be transmitted thought the one or more transparent displays 320 as illustrated above with reference to FIGS. 3C and 5A.

In some embodiments, the head-mounted display device is configured to allow a wearer to manually insert or remove the one or more removable blocking layers 603 without inputting the input signal. In such embodiments, the head-mounted display device may not include the receiver 601 and/or the actuator 602.

Figure 7:
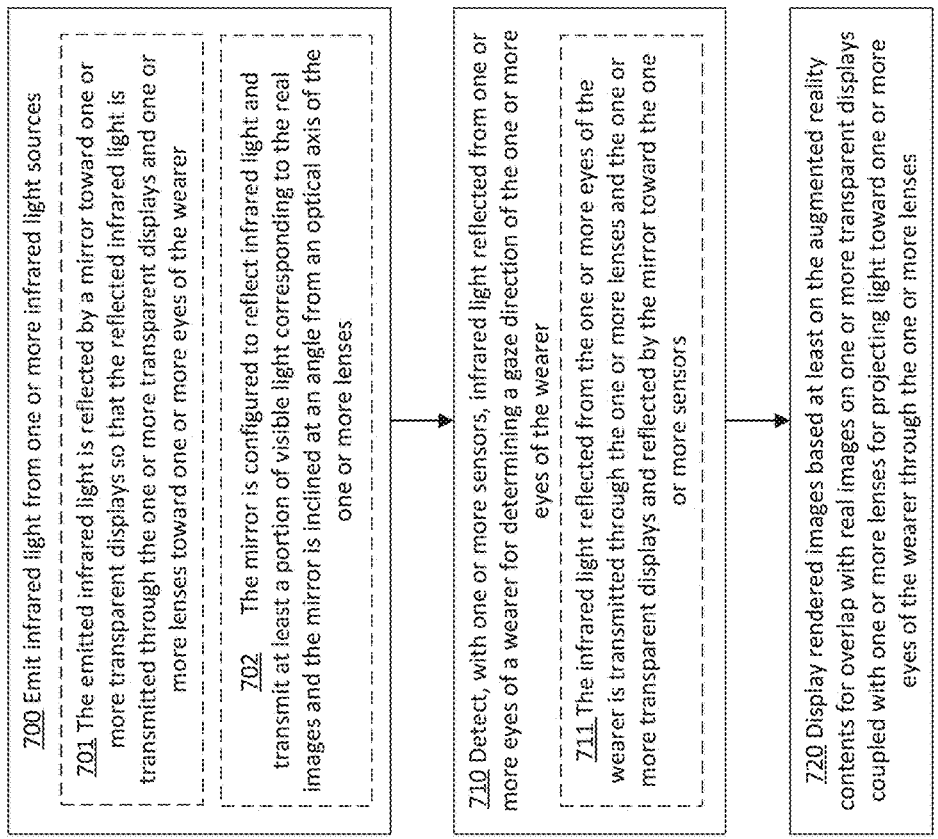
FIG. 7 is a flow diagram illustrating a method for providing augmented reality contents to a wearer in accordance with some embodiments.

FIG. 7 is a flow diagram illustrating a method for providing augmented reality contents to a wearer in accordance with some embodiments.

The method illustrated in FIG. 7 is performed by the head-mounted display device (e.g., head-mounted display device in FIGS. 1-5A).

In some embodiments, the head-mounted display device emits infrared light from the one or more infrared light sources, as described above with reference to FIGS. 1-6 (700). The emitted infrared light is reflected by a mirror (e.g., 322 in FIGS. 1-6) toward one or more transparent displays (e.g., 320 in FIGS. 1-6) so that the reflected infrared light is transmitted through the one or more transparent displays and one or more lenses (e.g., 310 in FIGS. 3A-3C) toward one or more eyes of the wearer (701).

In some embodiments, the mirror is configured to reflect infrared light and transmit at least a portion of visible light corresponding to the real images. The mirror is inclined at an angle from an optical axis of the one or more lenses, as described above with reference to FIGS. 1-6 (702).

The head-mounted display device detects, with one or more sensors (e.g., one or more sensors 340 in FIG. 3C), infrared light reflected from the one or more eyes of the wearer for determining a gaze direction of the one or more eyes of the wearer (710). The infrared light reflected from the one or more eyes of the wearer is transmitted through the one or more lenses and the one or more transparent displays and reflected by the mirror toward the one or more sensors, as described above with reference to FIG. 3C, (711).

The head-mounted display device displays rendered images based at least on the augmented reality contents for overlap with the real images on the one or more transparent displays coupled with the one or more lenses for projecting light toward one or more eyes of the wearer through the one or more lenses, as described above with reference to FIG. 5A (720).

Figure 8:
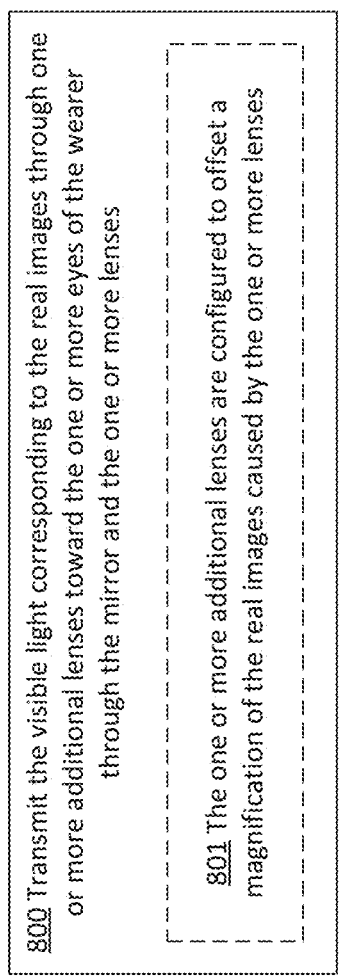
FIG. 8 is a flow diagram illustrating a method for transmitting visible light from the outside of a head-mounted display device in accordance with some embodiments.

FIG. 8 is a flow diagram illustrating a method for transmitting visible light from the outside of a head-mounted display device in accordance with some embodiments.

The method illustrated in FIG. 8 is performed by the head-mounted display device (e.g., head-mounted display device in FIGS. 1-5A).

In some embodiments, the head-mounted display device transmits the visible light corresponding to the real images through one or more additional lenses (e.g., one or more additional lenses 324 in FIGS. 3B-3C) toward the one or more eyes of the wearer through the mirror and the one or more lenses (800). Each of one or more additional lenses can be thinner than each of one or more lenses.

In some embodiments, the one or more additional lenses are configured to offset a magnification of the real images caused by the one or more lenses (801).

Figure 9:
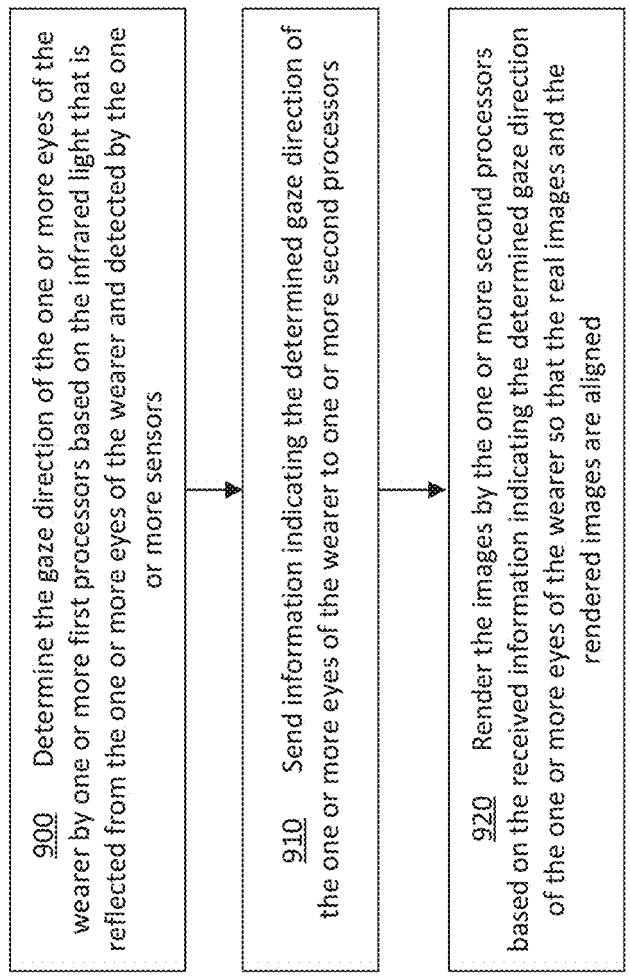
FIG. 9 is a flow diagram illustrating a method for rendering images to display on one or more transparent displays in accordance with some embodiments.

FIG. 9 is a flow diagram illustrating a method for rendering images to display on one or more transparent displays in accordance with some embodiments.

The method illustrated in FIG. 9 is performed by the head-mounted display device (e.g., head-mounted display device in FIGS. 1-5A).

In some embodiments, the head-mounted display device determines the gaze direction of the one or more eyes of the wearer by one or more first processors (e.g., one or more first processors 420 in FIG. 4) based on the infrared light that is reflected from the one or more eyes of the wearer and detected by the one or more sensors (900). In some embodiments, the head-mounted display device determines the gaze direction of the one or more eyes of the wearer by one or more first processors based on the infrared light that is reflected from the one or more eyes of the wearer and detected by the one or more sensors subsequent to detecting (710), with the one or more sensors, the infrared light reflected from the one or more eyes of a wearer for determining a gaze direction of the one or more eyes of the wearer.

In some embodiments, the head-mounted display device sends information indicating the determined gaze direction of the one or more eyes of the wearer to one or more second processors (e.g., one or more second processors 501 in FIG. 5A) (910).

In some embodiments, the head-mounted display device renders the images by the one or more second processors (e.g., one or more second processors 501 in FIG. 5A) based on the received information indicating the determined gaze direction of the one or more eyes of the wearer so that the real images and the rendered images are aligned (920). In some embodiments, rendering the image is distinct from displaying the rendered image. For example, the head-mounted display device generates information corresponding to an image or a partial image for display (which is often called rendering), and the head-mounted display device operates the one or more transparent display devices to project light that corresponds to the rendered image.

In some embodiments, subsequent to rendering the images by the one or more second processors (operation 920), the head-mounted display device displays the rendered images on the one or more transparent displays (e.g., operation 702 in FIG. 7).

In some embodiments, the one or more first processors and the one or more second processors can be included and operated in one or more processors. In this case, the one or more first processors and the one or more second processors are referred to as a processor or one or more processor.

In some embodiments, the head-mounted display device reflects a portion of the visible light provided from the outside of the device with a mirror (e.g., the mirror 322 in FIG. 3C and FIG. 5A). The head-mounted device display detects at least a portion of visible light reflected by the mirror using one or more cameras (e.g., one or more cameras 300 in FIG. 3C and FIG. 5A) and sends the information representing the real images corresponding to the detected portion of the visible light to the one or more second processors as described above with reference to FIG. 5A.

Figure 10:
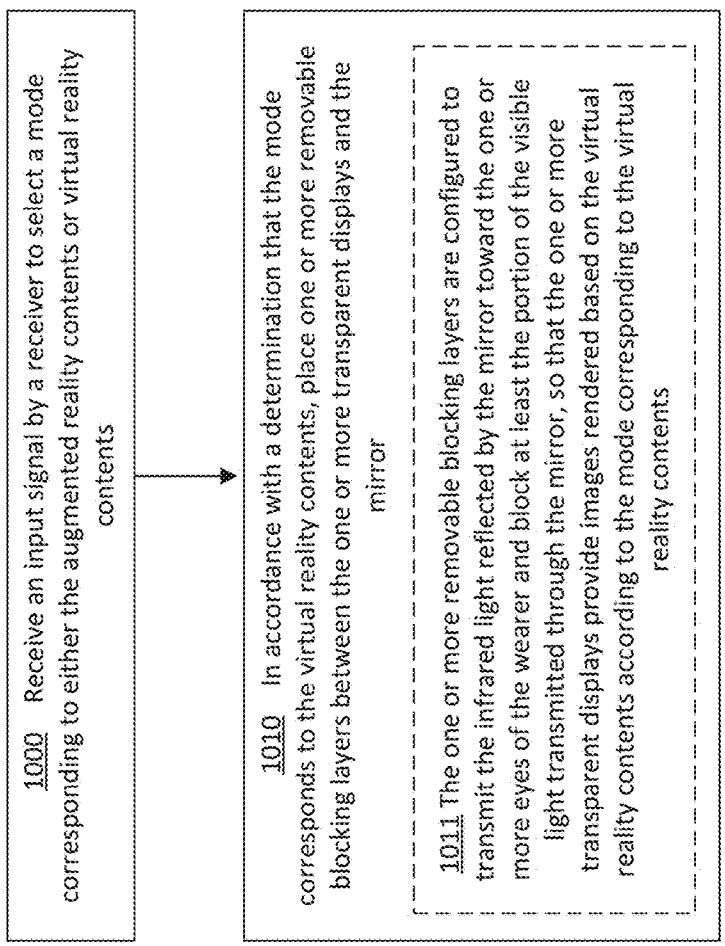
FIG. 10 is a flow diagram illustrating a method for providing virtual reality contents to a wearer in accordance with some embodiments.

FIG. 10 is a flow diagram illustrating a method for providing virtual reality contents to a wearer in accordance with some embodiments.

The method illustrated in FIG. 10 is performed by the head-mounted display device (e.g., head-mounted display device in FIGS. 1-5A).

In some embodiments, the head-mounted display device receives an input signal by a receiver (e.g., 601 in FIG. 6) to select a mode corresponding to either the augmented reality contents or virtual reality contents (1000).

The head-mounted display device, in accordance with a determination that the selected mode corresponds to virtual reality contents, places one or more removable blocking layers (e.g., one or more blocking layers 603 in FIG. 6) between the one or more transparent displays and the mirror (1010), as shown in FIG. 6.

The one or more removable blocking layers are configured to transmit the infrared light (or a significant portion thereof, such as 50% or more) reflected by the mirror toward the one or more eyes 350 of the wearer and block at least the portion of the visible light transmitted through the mirror (or a significant portion thereof, such as 50% or more). This allows the one or more transparent displays to provide images rendered based on the virtual reality contents while the head-mounted display device operates in the mode corresponding to the virtual reality contents (1011).

In some embodiments, in accordance with a determination that the mode corresponds to the augmented reality, the head-mounted display device starts operation 700 in shown in FIG. 7 to provide the augmented reality contents to the wearer.

In some embodiments, the head-mounted display device is configured to allow a wearer to manually insert or remove the one or more removable blocking layers without inputting the input signal. In such embodiments, the head-mounted display device may not include the receiver and/or the actuator.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

Embodiments described herein may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

What is claimed is:

1. A head-mounted display device for providing augmented reality contents to a wearer, the device comprising:
one or more lenses;
one or more transparent displays coupled with the one or more lenses for projecting light toward one or more eyes of the wearer through the one or more lenses, wherein the one or more transparent displays are configured to provide images rendered based at least on the augmented reality contents for overlap with real images;
a mirror configured to reflect infrared light and transmit at least a first portion of visible light corresponding to the real images, wherein the one or more transparent displays are disposed between the mirror and the one or more lenses and the mirror is inclined at an angle from an optical axis of the one or more lenses;
one or more infrared light sources positioned relative to the mirror in a way such that infrared light emitted by the one or more infrared light sources is reflected by the mirror toward the one or more transparent displays and so that the reflected infrared light is transmitted through the one or more transparent displays and the one or more lenses toward the one or more eyes of the wearer; and
one or more sensors positioned relative to the mirror in a way such that the one or more sensors detect infrared light reflected from the one or more eyes of the wearer for determining a gaze direction of the one or more eyes of the wearer, wherein the infrared light reflected from the one or more eyes of the wearer is transmitted through the one or more lenses and the one or more transparent displays and reflected by the mirror toward the one or more sensors.

2. The device of claim 1, wherein the one or more transparent displays include one or more organic light emitting diode displays.

3. The device of claim 1, wherein the visible light corresponding to the real images is provided from an outside of the device.

4. The device of claim 3, further including one or more additional lenses configured to transmit the visible light corresponding to the real images toward the one or more eyes of the wearer through the mirror and the one or more lenses.

5. The device of claim 4, wherein the one or more additional lenses are configured to offset a magnification of the real images caused by the one or more lenses.

6. The device of claim 1, including one or more first processors configured to determine the gaze direction of the one or more eyes of the wearer based on the infrared light that is reflected from the one or more eyes of the wearer and detected by the one or more sensors.

7. The device of claim 6, further including one or more second processors configured to render the images based on information indicating the determined gaze direction of the one or more eyes of the wearer so that the real images and the rendered images are aligned.

8. The device of claim 7, including one or more cameras configured to detect a second portion of the visible light corresponding to the real images and send information representing the real images to the one or more second processors.

9. The device of claim 8, wherein the mirror is configured to reflect the second portion of the visible light toward the one or more cameras for detection.

10. The device of claim 7, wherein the one or more first processors are further configured to send the information indicating the determined gaze direction of the one or more eyes of the wearer to the one or more second processors.

11. The device of claim 1, including one or more actuators configured to place one or more removable blocking layers between the one or more transparent displays and the mirror, wherein the one or more removable blocking layers are configured to transmit the infrared light reflected by the mirror toward the one or more eyes of the wearer and block at least the first portion of the visible light transmitted through the mirror so that the one or more transparent displays provide virtual reality contents according to a mode selected by the wearer.

12. A method for providing augmented reality contents to a wearer, the method comprising:
emitting infrared light from one or more infrared light sources, wherein:
the one or more infrared light sources are positioned relative to a mirror in a way such that the emitted infrared light is reflected by the mirror toward one or more transparent displays and the reflected infrared light is transmitted through the one or more transparent displays and one or more lenses toward one or more eyes of the wearer,
the mirror is configured to reflect the infrared light and transmit at least a portion of visible light corresponding to the real images,
the one or more transparent displays are disposed between the mirror and the one or more lenses, and
the mirror is inclined at an angle from an optical axis of the one or more lenses;
detecting, with one or more sensors, infrared light reflected from the one or more eyes of the wearer for determining a gaze direction of the one or more eyes of the wearer, wherein the one or more sensors are positioned relative to the mirror in a way such that infrared light reflected from the one or more eyes of the wearer is transmitted through the one or more lenses and the one or more transparent displays and reflected by the mirror toward the one or more sensors; and
displaying rendered images based at least on the augmented reality contents for overlap with the real images on the one or more transparent displays coupled with the one or more lenses for projecting light toward one or more eyes of the wearer through the one or more lenses.

13. The method of claim 12, including transmitting the visible light corresponding to the real images through one or more additional lenses toward the one or more eyes of the wearer through the mirror and the one or more lenses.

14. The method of claim 13, wherein the one or more additional lenses are configured to offset a magnification of the real images caused by the one or more lenses.

15. The method of claim 12, further including determining the gaze direction of the one or more eyes of the wearer by one or more first processors based on the infrared light that is reflected from the one or more eyes of the wearer and detected by the one or more sensors.

16. The method of claim 15, including sending information indicating the determined gaze direction of the one or more eyes of the wearer to one or more second processors.

17. The method of claim 16, including: rendering the images by one or more second processors based on the information indicating the determined gaze direction of the one or more eyes of the wearer so that the real images and the rendered images are aligned.

18. The method of claim 12, including:
receiving an input signal to select a mode corresponding to either the augmented reality contents or virtual reality contents; and
placing one or more removable blocking layers between the one or more transparent displays and the mirror when the mode corresponds to the virtual reality contents.

19. The method of claim 18, wherein the one or more removable blocking layers are configured to transmit the infrared light reflected by the mirror toward the one or more eyes of the wearer and block at least the portion of the visible light transmitted through the mirror, so that the one or more transparent displays provide images rendered based on the virtual reality contents according to the mode corresponding to the virtual reality contents.

* * * * *